United States Patent
Suenaga

(10) Patent No.: US 6,455,420 B1
(45) Date of Patent: *Sep. 24, 2002

(54) METHOD OF FORMING A COMPOUND FILM OF A SEMICONDUCTOR AND A METAL BY SELF-ALIGNMENT

(75) Inventor: Jun Suenaga, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/136,016

(22) Filed: Aug. 19, 1998

(30) Foreign Application Priority Data

Aug. 22, 1997 (JP) ............................................ P9-241783

(51) Int. Cl.⁷ ............................................... H01L 21/44
(52) U.S. Cl. ....................... 438/655; 438/299; 438/630; 438/632; 438/642; 438/664; 438/682
(58) Field of Search ................................. 438/655, 656, 438/660, 663, 682, 683, 664, 630, 642, 648, 649, 651, 229, 233, 299, 632

(56) References Cited

U.S. PATENT DOCUMENTS

| 4,358,889 A | * | 11/1982 | Dickman et al. ............. 29/571 |
| 5,023,201 A | * | 6/1991 | Stanasolovich et al. ...... 438/655 |
| 5,103,272 A | * | 4/1992 | Nishiyama ................. 357/23.4 |
| 5,593,923 A | * | 1/1997 | Horiuchi et al. ............. 438/305 |
| 5,620,926 A | * | 4/1997 | Itoh ........................... 438/530 |
| 5,773,347 A | * | 6/1998 | Kimura et al. ............... 438/302 |
| 5,940,699 A | * | 8/1999 | Sumi et al. .................. 438/233 |

FOREIGN PATENT DOCUMENTS

EP 0366343 * 2/1990

OTHER PUBLICATIONS

Gloesner et al, A one step annealing for dopant activation, silicide resistivity lowering and glass flow by rapid thermal processing, VLSI Multilevel Inerconnection Conference, pp 43–50, Jun. 1988.*

* cited by examiner

Primary Examiner—Tuan H. Nguyen
Assistant Examiner—Thanhha Pham
(74) Attorney, Agent, or Firm—Sonnenschein, Nath & Rosenthal

(57) ABSTRACT

A relatively high-resistance first compound film of a semiconductor and a metal is formed on a surface of a semiconductor region in self alignment by a relatively low-temperature first annealing. The relatively high-resistance first compound film is converted into a relatively low-resistance second compound film by a relatively high-temperature second annealing which is done after an insulating film is formed above the first compound film. Hence, the annealing aiming at decreasing a resistance of the compound film can serve as another annealing as well. The number of times of annealing applied to the compound film the resistance of which has been decreased is small, and a thinning effect of the compound film can be suppressed.

2 Claims, 5 Drawing Sheets

METHOD OF FORMING A COMPOUND FILM OF A SEMICONDUCTOR AND A METAL BY SELF-ALIGNMENT

BACKGROUND OF THE INVENTION

1. Field of the Invention

The present invention relates to a semiconductor device manufacturing method of forming a compound film of a semiconductor and a metal on a surface of a semiconductor region by self alignment.

2. Description of the Related Art

To micropattern a semiconductor device, e.g., a MOS transistor, and to increase its operation speed, the resistance of an impurity region formed in a semiconductor substrate and of an interconnection made of a semiconductor must be decreased. For this purpose, a structure in which a compound film of a semiconductor and a metal is formed on a surface of a semiconductor region by self alignment has been studied.

FIG. 1 shows the first related art of a method of manufacturing a MOS transistor having such a compound film. According to the first related art, an $SiO_2$ film 12 is selectively formed on a surface of an Si substrate 11 to determine an isolation region. A well 13 is formed in the Si substrate 11, and an $SiO_2$ film 14 serving as a gate oxide film is formed on the surface of an active region surrounded by the $SiO_2$ film 12.

Thereafter, a gate electrode is formed by a poly-Si film 15 or the like. A lightly doped impurity region 16 constituting a source-drain region having an LDD structure is formed. A side wall spacer constituted by an SiN film 17 is formed on a side face of the poly-Si film 15. A heavily doped impurity region 18 constituting a source-drain region having the LDD structure is formed, and a Ti film (not shown) is deposited on the entire surface of the Si substrate 11.

Thereafter, silicidation is caused at the interface between the Si substrate 11 or the poly-Si film 15 and the Ti film by a comparatively low-temperature first-step annealing, to form a comparatively high-resistance C49-phase $TiSi_2$ film (not shown). The unreacted Ti film and the like remaining on the $SiO_2$ film 12 and the SiN film 17 are removed. Phase transition of the C49-phase $TiSi_2$ film to a comparatively low-resistance C54-phase $TiSi_2$ film 21 is performed by a comparatively high-temperature second-step annealing.

The two-steps annealing is performed in this manner due to the following reason. If a high-temperature annealing that can immediately form the low-resistance C54-phase $TiSi_2$ film 21 is performed from the beginning, an Si is supplied from the impurity region 18 also to the Ti film on the $SiO_2$ film 12 and the SiN film 17, to form $TiSi_2$ films 21 on the $SiO_2$ film 12 and the SiN film 17 as well. Then, for instance, the $TiSi_2$ film 21 on the poly-Si film 15 and the $TiSi_2$ film 21 on the impurity region 18 may be short-circuited through the $TiSi_2$ film 21 on the SiN film 17.

After the C54-phase $TiSi_2$ film 21 is formed, an $SiO_2$ film 22, an $SiO_2$-based film 23, and an SiO2 film 24 serving as an interlayer insulating film are sequentially deposited, and contact holes 25 are formed to extend through the $SiO_2$ film 24, the $SiO_2$-based film 23, and the $SiO_2$ film 22. The contact holes 25 are filled with W films 26 or the like, and upper layer interconnections (not shown) and the like are formed, thus completing this MOS transistor.

FIG. 2 shows the second related art of the MOS transistor manufacturing method. In the second related art, after contact holes 25 are formed, an impurity is ion-implanted through the contact holes 25 to form an impurity region 27, having the same conductivity type as that of impurity regions 16 and 18, in the Si substrate 11. The impurity is activated by an annealing, and the contact holes 25 are filled with W films 26. Except for that, steps substantially identical to those of the first related art shown in FIG. 1 are performed.

In the first related art described above, as shown in FIG. 1, when the positions of the contact holes 25 are displaced due to an alignment error or the like of a mask in a photolithography for forming the contact holes 25, and the contact holes 25 are located on the end portions of the $SiO_2$ film 12, the $SiO_2$ film 12 is also etched together with the $SiO_2$ film 24, the $SiO_2$-based film 23, and the $SiO_2$ film 22.

As a result, a contact portion 28 is formed where the W films 26 that fill the contact holes 25, and the well 13 come into contact with each other directly and not through the impurity region 18. Even if the contact holes 25 are located on the SiN film 17, since the etching selectivity of the $SiO_2$ film 22, the $SiO_2$-based film 23, and the $SiO_2$ film 24 with respect to the SiN film 17 can be increased, the SiN film 17 will not be etched together with the $SiO_2$ film 22, the $SiO_2$-based film 23, and the $SiO_2$ film 24.

When the contact portion 28 is formed, even if the impurity region 18 and the well 13 are reverse-biased, a leakage current flows between the W films 26 and the well 13 through the contact portion 28. In order to prevent the contact holes 25 from locating on the end portions of the $SiO_2$ film 12 even if a mask alignment error or the like occurs during the photolithography, the area of the impurity region 18 cannot but be increased. This makes it impossible to manufacture a micropatterned MOS transistor.

In contrast to this, in the second related art described above, since the impurity region 27 is formed as shown in FIG. 2, a leakage current between the W films 26 and the well 13 is prevented, and the alignment error of the contact holes 25 is compensated. In the second related art, however, after the low-resistance C54-phase $TiSi_2$ film 21 is formed, an annealing for activating the impurity in the impurity region 27 is performed. This annealing agglomerates the $TiSi_2$ film 21 to increase its resistance.

An increase in resistance of the $TiSi_2$ film 21 caused by the annealing occurs conspicuously particularly on the poly-Si film 15 having a small line width. On the poly-Si film 15 having a line width of 0.15 $\mu$m, the sheet resistance which has been equal to or lower than 10 $\Omega$/ increases to about 50 $\Omega$/ upon the annealing at 850° C. for 30 seconds. Accordingly, in the second related art, a thinning effect occurs in the $TiSi_2$ film 21 due to the annealing that aims at activating the impurity for forming the impurity region 27.

In the first related art described above, the area of the impurity region 18 and the like cannot be decreased, and a micropatterned semiconductor device cannot accordingly be manufactured. In the second related art described above, a low-resistance $TiSi_2$ film 21 cannot be formed, and a high-speed semiconductor device cannot accordingly be manufactured. In fine, a micropatterned and high-speed semiconductor device cannot be manufactured with either the first or second related art described above.

SUMMARY OF THE INVENTION

It is, therefore, an object of the present invention to provide a method capable of manufacturing a micropatterned and high-speed semiconductor device at a low cost.

In a semiconductor device manufacturing method according to the present invention, a relatively high-resistance low-resistance second compound film by a relatively high-temperature second annealing which is done after an insulating film is formed. Hence, the annealing aiming at decreasing a resistance of the compound film can also serve as another annealing as well, and the number of times of annealing applied to the compound film the resistance of which has been decreased is small. As a result, a thinning effect of the compound film caused by an agglomeration can be suppressed, and a sheet resistance of the semiconductor region and the compound film can be decreased, while the number of manufacturing steps is small. A micropatterned and high-speed semiconductor device can accordingly be manufactured at a low cost.

In a preferred semiconductor device manufacturing method according to the present invention, the annealing aiming at decreasing the resistance of the compound film also serves as an annealing aiming at activating an impurity introduced through contact holes. As a result, the number of times of annealing applied to the compound film the resistance of which has been decreased is small, the thinning effect of the compound film can be suppressed, the number of manufacturing steps is small, and the alignment error of the contact holes is compensated thereby increasing a yield. A micropatterned and high-speed semiconductor device can be manufactured at a low cost.

In a preferred semiconductor device manufacturing method according to the present invention, the annealing aiming at decreasing the resistance of the compound film also serves as an annealing aiming at planarizing the insulating film by a reflow. As a result, the number of times of annealing applied to the compound film the resistance of which has been decreased is small, the thinning effect of the compound film can be suppressed, the number of manufacturing steps is small, and a lithography or the like to pattern an interconnection can be facilitated thereby increasing a yield. A micropatterned and high-speed semiconductor device can accordingly be manufactured at a low cost.

In a preferred semiconductor device manufacturing method according to the present invention, the annealing aiming at decreasing the resistance of the compound film also serves as an annealing aiming at densifying and stabilizing the insulating film in accordance with a densification. As a result, the number of times of annealing applied to the compound film the resistance of which has been decreased is small, the thinning effect of the compound film can be suppressed, the number of manufacturing steps is small, and a quality of the insulating film is improved thereby increasing a yield. A micropatterned and high-speed semiconductor device can accordingly be manufactured at a low cost.

In a preferred semiconductor device manufacturing method according to the present invention, the second annealing is performed at a temperature of 750° C. to 900° C. for a time of 5 to 60 seconds. The resistance of the compound film can be effectively decreased, and a micropatterned and high-speed semiconductor device can accordingly be manufactured at a low cost.

In a preferred semiconductor device manufacturing method according to the present invention, a metal film is formed after an amorphous film is formed on the surface of the semiconductor region, so that the reaction between the semiconductor region and the metal film to produce a compound can be promoted. The compound film is formed stably to suppress the thinning effect, so that a micropatterned and high-speed semiconductor device can be manufactured at a low cost.

In a preferred semiconductor device manufacturing method according to the present invention, in a semiconductor region where an N-type impurity region is to be formed, an N-type impurity is ion-implanted with the surface of the semiconductor region begin exposed. Therefore, the N-type impurity can be ion-implanted to a comparatively deep position in the semiconductor region. Even with an N-type impurity, e.g., As, having a comparatively small diffusion coefficient, an N-type impurity region having a comparatively deep junction can be formed.

Since the N-type impurity can be ion-implanted to the comparatively deep position in the semiconductor region, the impurity concentration at the surface of the N-type impurity region can be decreased. Also, an oxygen is suppressed from mixing in the semiconductor region by a knock-on effect, as in a case wherein a coating film is an $SiO_2$ film or the like. Therefore, the reaction between the semiconductor region and the metal film to produce a compound can be promoted.

In a semiconductor region where a P-type impurity region is to be formed, a P-type impurity is ion-implanted with the surface of the semiconductor region being covered with a coating film. Even if a compound, e.g., $BF_2^+$, of a P-type impurity and another impurity is ion-implanted, the impurity other than the P-type impurity can be suppressed from mixing in the semiconductor region, thereby promoting the reaction between the semiconductor region and the metal film to produce a compound.

Since the P-type impurity is ion-implanted through the coating film with the surface of the semiconductor region being covered with the coating film, the P-type impurity can be ion-implanted to a comparatively shallow position in the semiconductor region. Even with a P-type impurity, e.g., B, having a large diffusion coefficient, a P-type impurity region having a comparatively shallow junction can be formed.

In other words, in both the semiconductor region where the N-type impurity region is to be formed and the semiconductor region where the P-type impurity region is to be formed, the reaction between the semiconductor region and the metal film to produce a compound can be promoted. The compound film can be stably formed to suppress the thinning effect, so that a micropatterned and high-speed semiconductor device can be manufactured at a low cost.

Since the N-type impurity region having a comparatively deep junction can be formed, even if a compound film is formed on the surface, an N-type impurity region having little junction leakage can be formed. Since the P-type impurity region having a comparatively shallow junction can be formed, a short-channel effect can be suppressed. As a result, a highly reliable semiconductor device can be manufactured.

In a preferred semiconductor device manufacturing method according to the present invention, a Ti film is used as the metal film, and a Ti compound film is formed by the reaction between the semiconductor region and the Ti film to produce a compound. Therefore, an annealing aiming at decreasing a resistance of the Ti compound film can also serve as another annealing, and accordingly the number of times of annealing applied to the Ti compound film the resistance of which has been decreased is small. As a result, the thinning effect of the Ti compound film which tends to agglomerate particularly easily can be suppressed, and the sheet resistance of the semiconductor region and the Ti compound film can be decreased, so that a micropatterned and high-speed semiconductor device can be manufactured at a low cost.

DETAILED DESCRIPTION OF THE PREFERRED EMBODIMENTS

Figure 1:
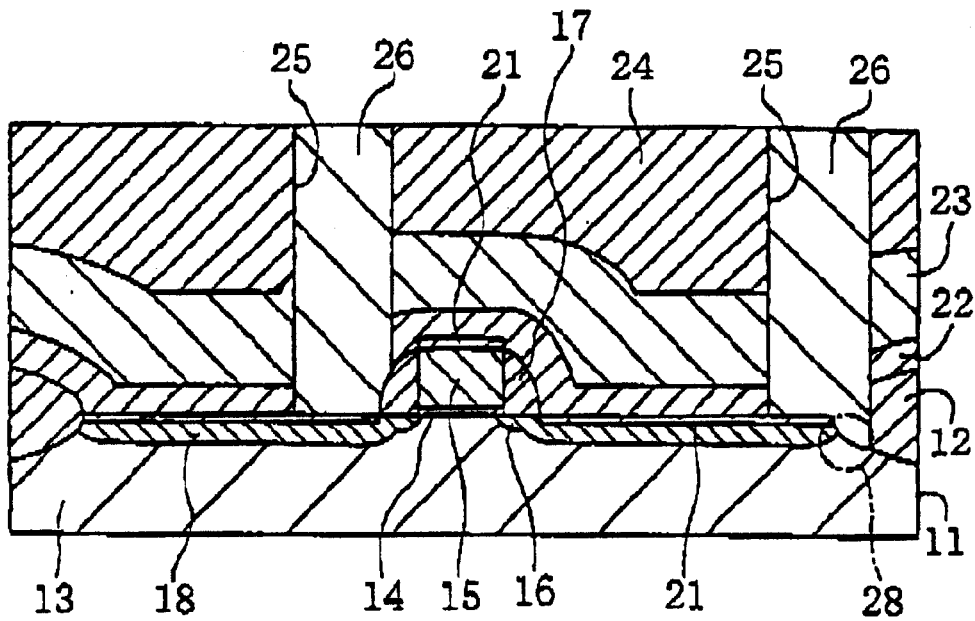
FIG. 1 is a side sectional view of a MOS transistor manufactured in accordance with the first related art of the present invention.
Figure 2:
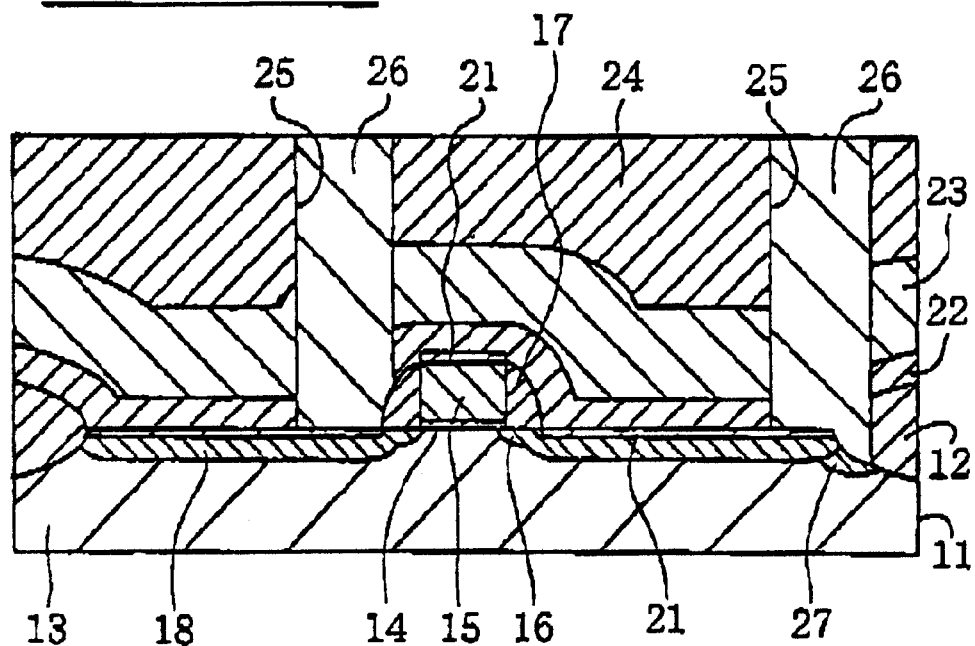
FIG. 2 is a side sectional view of a MOS transistor manufactured in accordance with the second related art of the present invention.
Figure 3A:
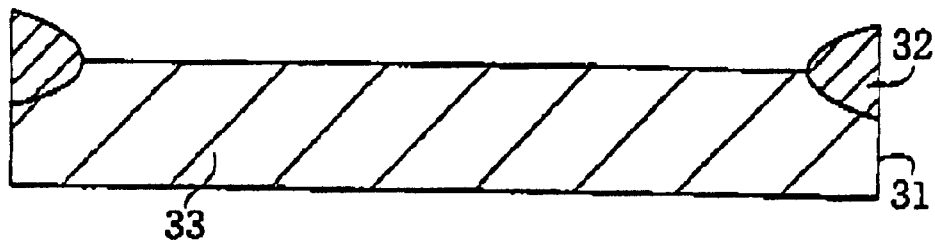
FIGS. 3A to 3D are side sectional views sequentially showing the initial steps of the first embodiment of the present invention.

The first to fifth embodiments of the present invention applied to a MOS transistor manufacturing method will be described with reference to FIGS. 3A to 6. In the first embodiment, an $SiO_2$ film 32 is selectively formed on a surface of an Si substrate 31 to determine an isolation region by a LOCOS method of performing a wet oxidation at 950° C., as shown in FIG. 3A. In place of the LOCOS method, an isolation can be performed in accordance with a trench method or the like.

Impurities are ion-implanted in the Si substrate 31 to form a well 33 in the Si substrate 31, to form a buried layer (not shown) for suppressing the punch-through between a source region and a drain region of the MOS transistor and to adjust a threshold voltage of the MOS transistor.

Figure 3B:
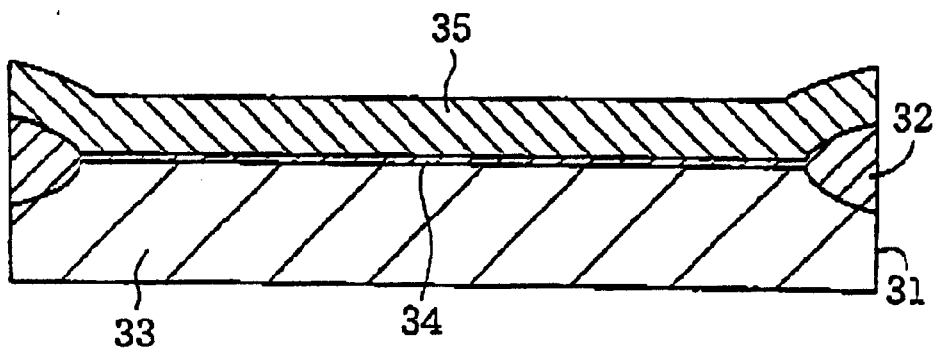

As shown in FIG. 3B, an $SiO_2$ film 34 having a thickness of about 5 nm is formed as a gate oxide film on the surface of an active region surrounded by the $SiO_2$ film 32, in accordance with pyrogenic oxidation using $H_2/O_2$ and performed at 850° C., or the like. A poly-Si film 35 having a thickness of about 200 nm is deposited on an entire surface of the resultant structure. In place of the poly-Si film 35, an amorphous Si film, a composite film of an amorphous Si film and a poly-Si film, or the like may be formed.

Figure 3C:
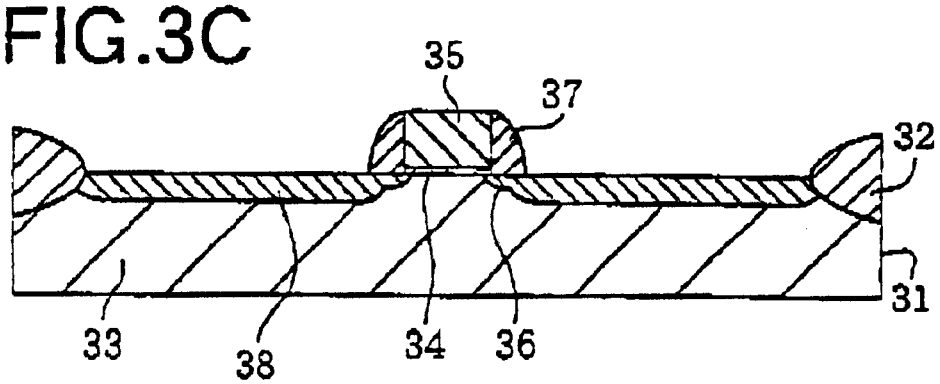

As shown in FIG. 3C, the poly-Si film 35 is formed into a gate electrode pattern by a photolithography and an anisotropic dry etching. Using the poly-Si film 35 and the $SiO_2$ film 32 as masks, an impurity is ion-implanted in the Si substrate 31 to form a lightly doped impurity region 36 constituting a source-drain region having an LDD structure.

Thereafter, an SiN film 37 having a thickness of 100 nm to 200 nm is deposited on an entire surface of the resultant structure. An entire surface of the SiN film 37 is etched back to form a side wall spacer constituted by the SiN film 37 on a side face of the poly-Si film 35. Using the poly-Si film 35, the SiN film 37, and the $SiO_2$ film 32 as masks, an impurity is ion-implanted in the Si substrate 31 to form a heavily doped impurity region 38 constituting the source-drain region having the LDD structure.

To form an N-type impurity region 38, As is ion-implanted at a dose of $3 \times 10^{15}/cm^2$. To form a P-type impurity region 38, $BF_2$ is ion-implanted at a dose of $3 \times 10^{15}/cm^2$. The impurities in the impurity regions 36 and 38 are activated by a rapid thermal annealing at 1,000° C. for about 10 seconds or the like.

Figure 3D:
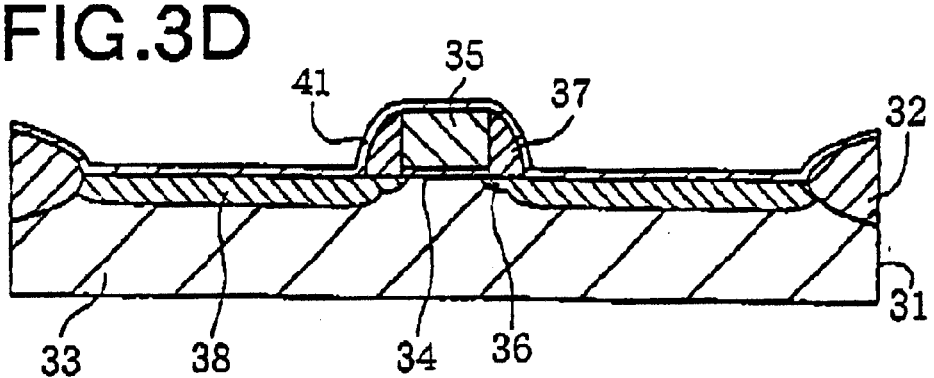
Figure 4A:
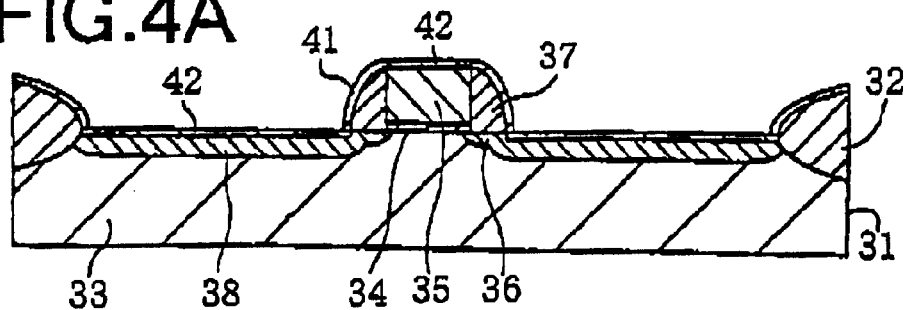
FIGS. 4A to 4D are side sectional views sequentially showing the steps following FIGS. 3A to 3D.

As shown in FIG. 3D, a Ti film 41 having a thickness of about 30 nm is deposited by a sputtering or the like. As shown in FIG. 4A, a silicidation is caused in an interface between the Si substrate 31 or the poly-Si film 35 and the Ti film 41 by a rapid thermal annealing at 650° C. for 30 seconds in a nitrogen atmosphere or the like, thereby forming a comparatively high-resistance C49-phase $TiSi_2$ film 42.

Figure 4B:
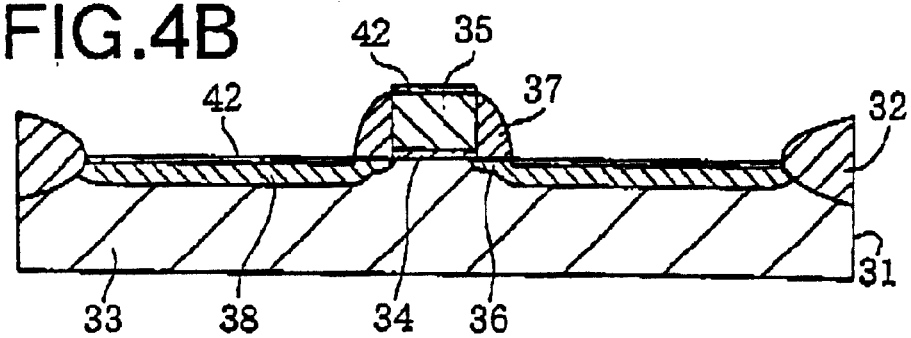

As shown in FIG. 4B, the unreacted Ti film 41 remaining on the $SiO_2$ film 32 and the SiN film 37, and a TiN film (not shown) formed by the annealing in the nitrogen atmosphere are removed with aqueous ammonia hydrogen peroxide. Accordingly, the C49-phase $TiSi_2$ film 42 is left on only the surface of the impurity region 38 and the surface of the poly-Si film 15.

Figure 4C:
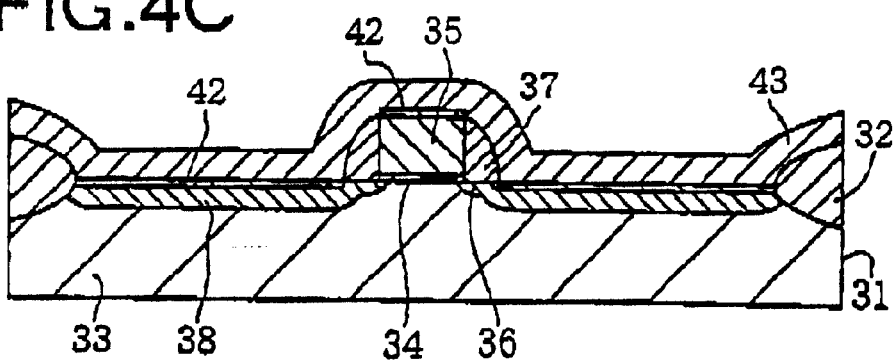
Figure 5A:
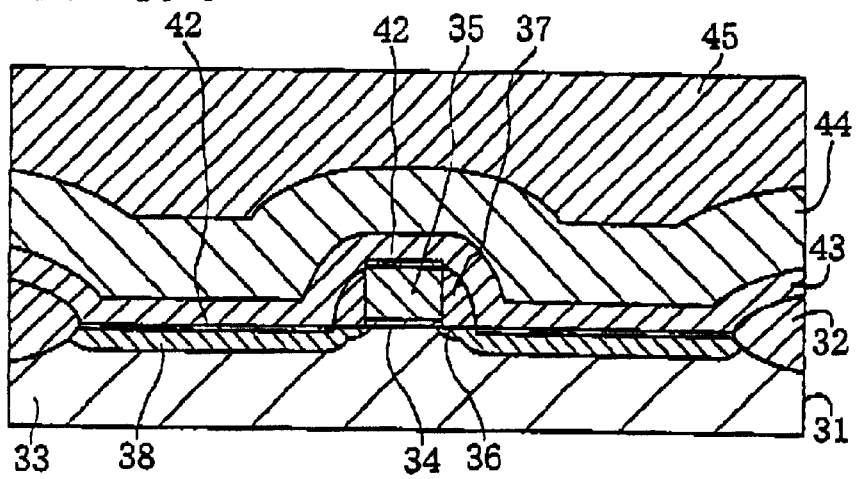
FIGS. 5A to 5C are side sectional views sequentially showing the steps following FIGS. 4A to 4D.

As shown in FIG. 4C, an $SiO_2$ film 43 having a thickness of about 100 nm is deposited, and an $SiO_2$-based film 44, e.g., a BSG film, a PSG film, or a BPSG film, having a thickness of about 300 nm is deposited. As shown in FIG. 5A, an $SiO_2$ film 45 is deposited by a plasma CVD method using TEOS (TetraEthyl OrthoSilicate) as a material, and a surface of the $SiO_2$ film 45 is planarized by a chemical mechanical polishing. As a result, an interlayer insulating film is formed by the $SiO_2$ film 43, the $SiO_2$-based film 44, and the $SiO_2$ film 45.

Figure 5B:
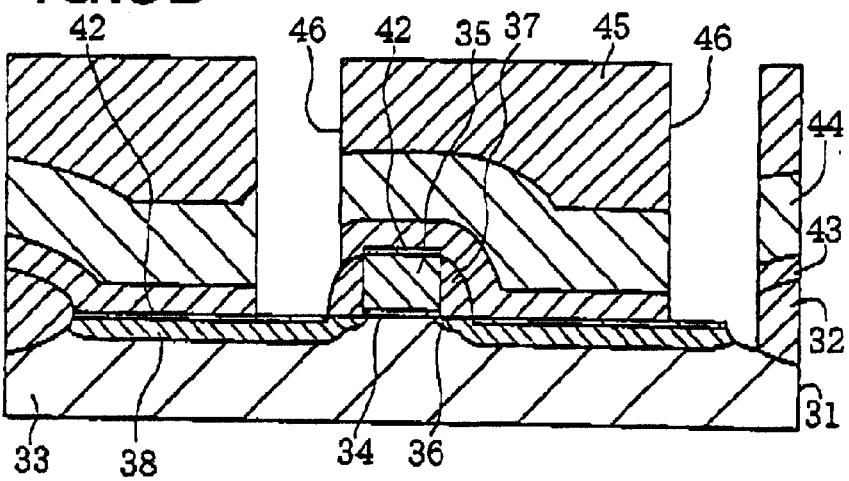

As shown in FIG. 5B, contact holes 46 are formed to extend through the $SiO_2$ film 45, the $SiO_2$-based film 44, and the $SiO_2$ film 43 by a photolithography and a dry etching. FIG. 5B shows a state wherein positions of the contact holes 46 are displaced to locate on end portions of the $SiO_2$ film 32.

Figure 5C:
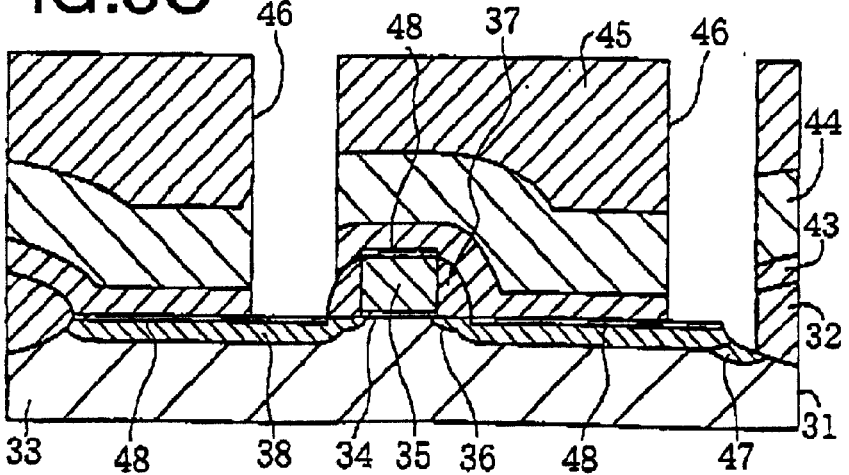

As shown in FIG. 5C, an impurity is ion-implanted through the contact holes 46 to form an impurity region 47, having the same conductivity type as that of the impurity regions 36 and 38, in the Si substrate 31. A rapid thermal annealing at 750° C. to 900° C. is performed for about 5 to 60 seconds to activate the impurity in the impurity region 47, and to simultaneously cause a phase transition of the comparatively high-resistance C49-phase $TiSi_2$ film 42 to a comparatively low-resistance C54-phase $TiSi_2$ film 48.

Figure 6:
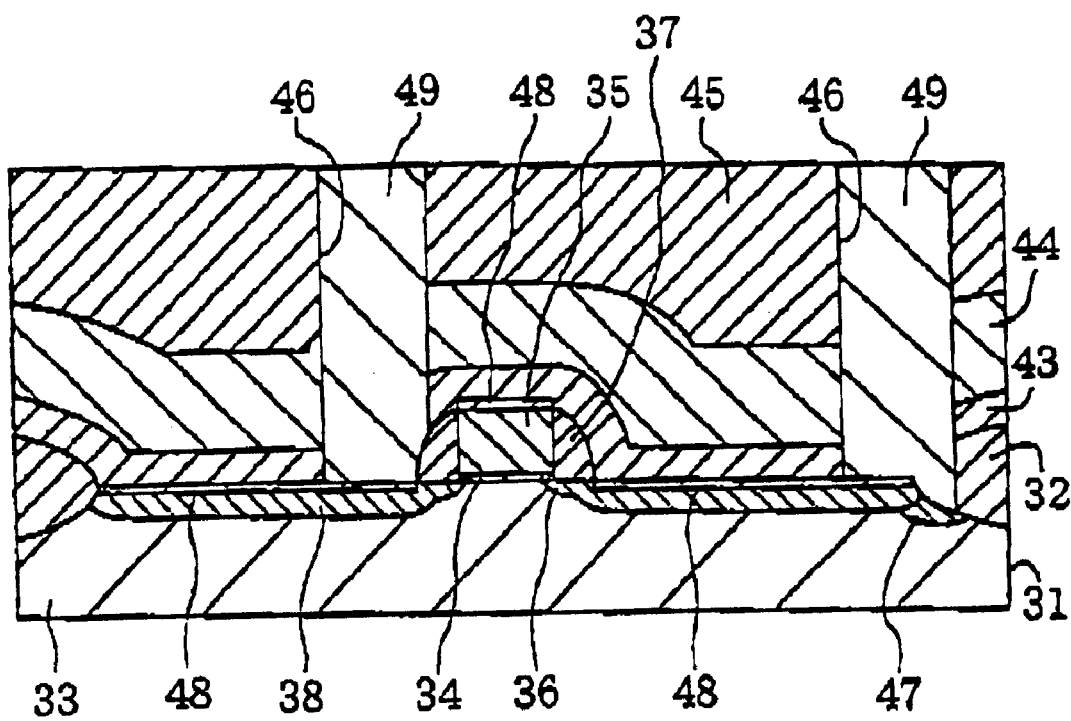
FIG. 6 is a side sectional view of a MOS transistor manufactured in accordance with the first embodiment.

Since the annealing at this time is a high-temperature annealing which is performed to the C49-phase $TiSi_2$ film 42 for the first time, it causes only the phase transition and does not cause an agglomeration. Thereafter, as shown in FIG. 6, the contact holes 46 are filled with W films 49 or the like, and furthermore upper layer interconnections (not shown) and the like are formed, thereby completing this MOS transistor.

Figure 4D:
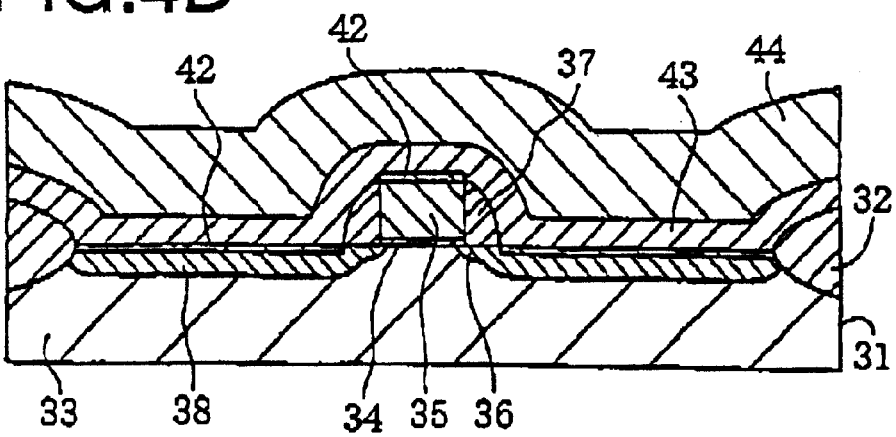

The second embodiment in which the $SiO_2$-based film 44 is subjected to reflow will be described. In the second embodiment, after the $SiO_2$-based film 44 is formed as shown in FIG. 4D, an annealing is performed at, e.g., 750° C. to 800° C. for about 5 to 10 minutes to reflow the $SiO_2$-based film 44. Simultaneously, the phase transition of the C49-phase $TiSi_2$ film 42 to the C54-phase $TiSi_2$ film 48 is performed. Except for that, steps substantially identical to those of the above-described first embodiment shown in FIGS. 3A to 6 are performed. In the second embodiment, the impurity region 47 is not formed, or if formed, a low-temperature and short-period activating annealing is performed to such a degree not to agglomerate the $TiSi_2$ film 42.

The third embodiment in which the $SiO_2$-based film 44 is subjected to densifying will be described. In the third embodiment, after the $SiO_2$-based film 44 is formed as shown in FIG. 4D, an annealing is performed, e.g., at 750° C. to 800° C. for about 5 to 10 minutes to densify the $SiO_2$-based film 44. Simultaneously, the phase transition of the C49-phase $TiSi_2$ film 42 to the C54-phase $TiSi_2$ film 48 is performed. Except for that, steps substantially identical to those of the above-described first embodiment shown in FIGS. 3A to 6 are performed. In the third embodiment, the impurity region 47 is not formed, or if formed, a low-temperature and short-period activating annealing is performed to such a degree not to agglomerate the $TiSi_2$ film 42.

In the third embodiment, the SiO$_2$-based film 44 is formed by a CVD method using mainly TEOS as a material.

The fourth embodiment will be described. In the fourth embodiment, the impurity region 38 is formed as shown in FIG. 3C, and As is ion-implanted in the Si substrate 31 and the poly-Si film 35 to form an amorphous layer (not shown) on their surfaces. Thereafter, the Ti film 41 is deposited as shown in FIG. 3D. Except for that, steps substantially identical to those of the above-described first embodiment shown in FIGS. 3A to 6 are performed.

In this fourth embodiment, since the silicidation for forming the TiSi$_2$ film 42 takes place while the surfaces of the Si substrate 31 and the poly-Si film 35 are amorphous, this silicidation can be promoted, so that the TiSi$_2$ film 42 can be stably formed, thereby suppressing the thinning effect.

The fifth embodiment will be described. In the fifth embodiment, the present invention is applied to a CMOS transistor manufacturing method. An ion implantation of an N-type impurity for forming an N-type impurity region is performed while a surface of an Si substrate is exposed. An ion implantation of a P-type impurity for forming a P-type impurity region is performed while the surface of the Si substrate is covered with an SiO$_2$ film or the like. Except for that, steps substantially identical to those of the above-described first embodiment shown in FIGS. 3A to 6 are performed.

In this fifth embodiment as well, the silicidation for forming the TiSi$_2$ film 42 can be promoted, and the TiSi$_2$ film 42 can be stably formed to suppress the thinning effect. In addition, the N-type impurity region in which a junction leakage does not occur often can be formed at the NMOS transistor portion, and a short-channel effect can be suppressed in the PMOS transistor region.

In any of the first to fifth embodiments described above, the TiSi$_2$ film 48 is formed as the silicide film. However, a silicide film of a refractory metal other than Ti may be formed.

What is claimed is:

1. A method for making a semiconductor device in which a compound film of a semiconductor and a metal is formed on a surface of a semiconductor region, said method comprising the sequential steps of:

forming a metal film over said semiconductor region;

then, annealing said metal film at a first temperature effective to generate a silicide layer having a first resistance as said compound film;

then, forming an interlayer insulating film over said compound film;

then, forming a connection hole in said insulating film;

then, introducing an impurity in a region of said semiconductor region exposed via a bottom surface of said connection hole through said connection hole;

then, annealing said semiconductor device a second time at a second temperature higher than the first temperature, said second annealing at said second time effective to activate said impurity and effective to impact to said compound film a second resistance which is lower than said first resistance, wherein said annealing at said second time is performed at a temperature of 750° C. to 900° C. for 5 to 60 sec; and then, after annealing said semiconductor device a second time, depositing at least one metal layer on said semiconductor device.

2. A method for making a semiconductor device in which a compound film of a semiconductor and a metal is formed on a surface of a semiconductor region, said method comprising the sequential steps of:

forming an amorphous layer on said surface of said semiconductor region by an ion implantation to said semiconductor region;

then, forming a metal film on said amorphous layer after said ion implantation;

then, annealing said metal film at a first temperature effective to generate a silicide layer having a first resistance as said compound film;

then, forming an interlayer insulating film over said compound film;

then, forming a connection hole in said insulating film;

then, introducing an impurity in a region of said semiconductor region exposed via a bottom surface of said connection hole through said connection hole;

then, annealing said semiconductor device a second time at a second temperature higher than the first temperature, said second annealing at said second time effective to activate said impurity and effective to impact to said compound film a second resistance which is lower than said first resistance, wherein said annealing at said second time is performed at a temperature of 750° C. to 900° C. for 5 to 60 sec; and then, after annealing said semiconductor device a second time, depositing at least one metal layer on said semiconductor device.

* * * * *